US010193557B2

(12) United States Patent
Sato et al.

(10) Patent No.: US 10,193,557 B2
(45) Date of Patent: Jan. 29, 2019

(54) OSCILLATION CONTROL APPARATUS AND OSCILLATION APPARATUS

(71) Applicant: Asahi Kasei Microdevices Corporation, Tokyo (JP)

(72) Inventors: Takayuki Sato, Tokyo (JP); Haruhiko Maru, Tokyo (JP); Katsuhiko Uchinami, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 191 days.

(21) Appl. No.: 15/464,351

(22) Filed: Mar. 21, 2017

(65) Prior Publication Data

US 2017/0279453 A1    Sep. 28, 2017

(30) Foreign Application Priority Data

Mar. 22, 2016   (JP) .................................. 2016-057118
Feb. 16, 2017   (JP) .................................. 2017-026929

(51) Int. Cl.
*H03B 5/04*   (2006.01)
*H03B 5/36*   (2006.01)
*H03L 1/02*   (2006.01)
*H03B 5/32*   (2006.01)

(52) U.S. Cl.
CPC ............... *H03L 1/023* (2013.01); *H03B 5/04* (2013.01); *H03B 5/32* (2013.01); *H03B 5/368* (2013.01); *H03L 1/028* (2013.01)

(58) Field of Classification Search
CPC .......... H03B 5/366; H03B 5/368; H03B 5/36; H03B 5/04; H03L 1/028; H03L 1/022
See application file for complete search history.

(56) References Cited

U.S. PATENT DOCUMENTS

| 5,801,596 | A | 9/1998 | Sakurai |
| 9,306,580 | B2 * | 4/2016 | Kiyohara ................. H03L 7/00 |
| 2003/0064694 | A1 | 4/2003 | Oka et al. |
| 2010/0127787 | A1 * | 5/2010 | Kurogo .................... H03B 5/04 |
| | | | 331/158 |

FOREIGN PATENT DOCUMENTS

| JP | 2010-161532 A | 7/2010 |
| JP | 2010-166438 A | 7/2010 |
| JP | 2010-219980 A | 9/2010 |
| JP | 2010-278622 A | 12/2010 |

* cited by examiner

*Primary Examiner* — Ryan Johnson

(57) ABSTRACT

Provided is an oscillation apparatus and an oscillation control apparatus including a first control section that generates a first control signal that controls an oscillation frequency of an oscillator, based on a temperature detection result of a temperature detecting section; an encoder that generates a feedback signal; a second control section that generates a second control signal that controls the oscillation frequency of the oscillator, based on the temperature detection result of the temperature detecting section, an external input signal input from outside, and the feedback signal; an oscillation circuit that sets the oscillation frequency of the oscillator, based on the first control signal and the second control signal; and a reference voltage generating section that generates a reference voltage, wherein the encoder generates the feedback signal by comparing the second control signal and the reference voltage.

12 Claims, 11 Drawing Sheets

OSCILLATION CONTROL APPARATUS AND OSCILLATION APPARATUS

The contents of the following Japanese patent applications are incorporated herein by reference:
NO. 2016-057118 filed on Mar. 22, 2016, and
NO. 2017-026929 filed on Feb. 16, 2017.

BACKGROUND

1. Technical Field

The present invention relates to an oscillation control apparatus and an oscillation apparatus.

2. Related Art

Conventionally, in an oscillation circuit that causes an oscillator to oscillate, the oscillation frequency is adjusted using a compensation circuit that compensates for the temperature characteristic of the oscillation frequency of the oscillator. Furthermore, a technique is known of adjusting the oscillation frequency of the oscillator according to a control signal input from the outside, while such a temperature compensation operation is being performed, as shown in Patent Documents 1 and 2, for example.

Patent Document 1: Japanese Patent Application Publication No. 2010-219980
Patent Document 2: Japanese Patent Application Publication No. 2010-278622

However, even when the oscillation frequency of the oscillator is adjusted in this manner, when there is an error in the offset or the like in the circuit used for adjustment or the like, there are cases where it is difficult to accurately adjust the oscillation frequency. Furthermore, when adjusting the oscillation frequency by comparing a control signal, which is an input voltage or the like from the outside, and a reference voltage or the like, if this control signal has a voltage that is substantially the same as the reference voltage, incorrect switching of the control operation occurs and the oscillation operation becomes unstable.

SUMMARY

Therefore, it is an object of an aspect of the innovations herein to provide an oscillation control apparatus and an oscillation apparatus, which are capable of overcoming the above drawbacks accompanying the related art. The above and other objects can be achieved by combinations described in the claims. According to a first aspect of the present invention, provided is an oscillation control apparatus comprising a first control section that generates a first control signal that controls an oscillation frequency of an oscillator, based on a temperature detection result of a temperature detecting section; an encoder that generates a feedback signal; a second control section that generates a second control signal that controls the oscillation frequency of the oscillator, based on the temperature detection result of the temperature detecting section, an external input signal input from outside, and the feedback signal; an oscillation circuit that sets the oscillation frequency of the oscillator, based on the first control signal and the second control signal; and a reference voltage generating section that generates a reference voltage, wherein the encoder generates the feedback signal by comparing the second control signal and the reference voltage.

According to a second aspect of the present invention, provided is an oscillation apparatus comprising an oscillator; a temperature detecting section that detects a temperature of the oscillator; an input terminal that inputs an external input signal from outside; and the oscillation control apparatus according to the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
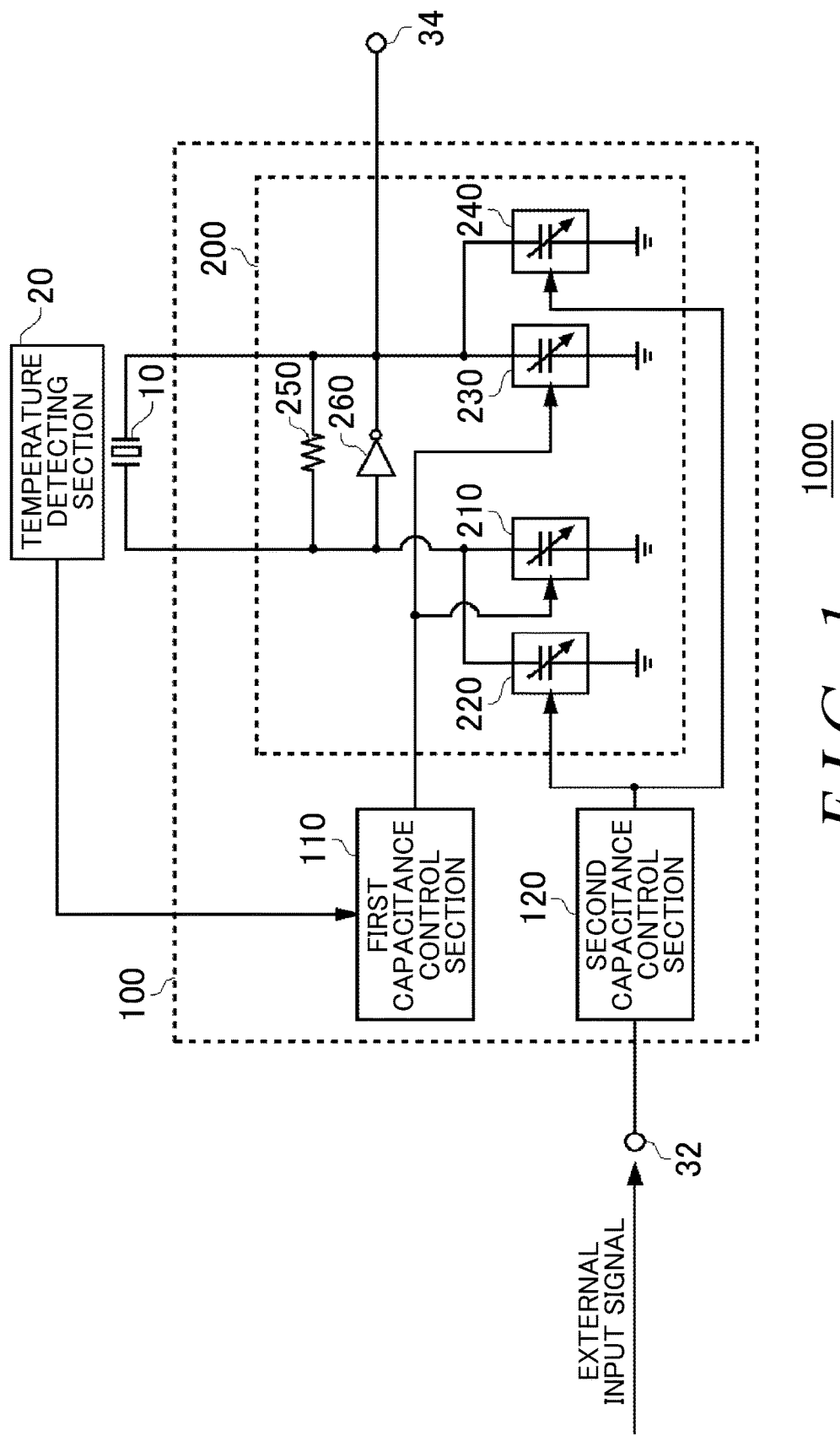
FIG. 1 shows a first exemplary configuration of an oscillation apparatus 1000 according to an embodiment of the present invention.

FIG. 1 shows a first exemplary configuration of an oscillation apparatus 1000 according to an embodiment of the present invention. The oscillation apparatus 1000 adjusts the oscillation frequency of an oscillator according to an input voltage or the like input from the outside, while compensating for a temperature characteristic of the oscillation frequency of the oscillator. The oscillation apparatus 1000 includes an oscillator 10, a temperature detecting section 20, an input terminal 32, an output terminal 34, a first capacitance control section 110, a second capacitance control section 120, and an oscillation circuit 200. The first capacitance control section 110, the second capacitance control section 120, and the oscillation circuit 200 function as an oscillation control apparatus 100 that controls the oscillation of the oscillator 10.

The oscillator 10 is an element that performs an oscillation operation according to a piezoelectric effect caused by deformation in response to the application of an electrical field. The oscillator 10 is a crystal oscillator in which crystals are provided between two electrodes, for example. The oscillator 10 may be capable of adjusting the oscillation frequency according to the capacitance of a circuit connected thereto. The oscillator 10 may be formed by cleaving in an orientation referred to as AT. The oscillation frequency of the oscillator 10 fluctuates according to the temperature of the oscillator 10. Furthermore, the oscillation frequency of the oscillator 10 changes along with aging due to operating over a long period of time. The oscillation apparatus 1000 adjusts the oscillation frequency of such an oscillator 10.

The temperature detecting section 20 detects the temperature of the oscillator 10. The temperature detecting section 20 may include a temperature sensor that detects the surrounding temperature of the oscillator 10. The temperature detecting section 20 may detect the temperature of the oscillator 10 by contacting the oscillator 10, or may instead detect the temperature of the oscillator 10 in a non-contact manner. The oscillation apparatus 1000 adjusts the oscillation frequency of the oscillator 10 according to the detection results of the temperature detecting section 20.

The input terminal 32 inputs an external input signal from the outside. Here, the external input signal is a control signal for adjusting the oscillation frequency of the oscillator 10. As an example, the external input signal is a control signal for correcting aging fluctuation caused by operation of the oscillator 10 over a long time period. The external input signal may be a voltage signal or the like. In the present embodiment, the control for correcting the aging fluctuation of such an oscillator 10 is AFC (Auto Frequency Control).

The output terminal 34 outputs the frequency signal adjusted by the oscillation apparatus 1000 to the outside. Specifically, the frequency signal output from the output terminal 34 is a frequency signal that has been adjusted according to temperature compensation and AFC.

The first capacitance control section 110 controls the capacitance of a circuit connected to the oscillator 10, based on the temperature detection results of the temperature detecting section 20. The first capacitance control section 110 controls the capacitance of the circuit connected to the oscillator 10 to adjust the oscillation frequency of the oscillator 10. The first capacitance control section 110 controls the capacitance of the circuit in a manner to compensate for the temperature characteristic of the oscillation frequency of the oscillator 10. The first capacitance control section 110 may increase or decrease the capacitance using a control signal based on a predetermined function, according to the temperature detection result of the temperature detecting section 20.

The second capacitance control section 120 controls the capacitance of the circuit connected to the oscillator 10 based on the external input signal input from the outside. The second capacitance control section 120 controls the capacitance of the circuit connected to the oscillator 10 to adjust the oscillation frequency of the oscillator 10. The second capacitance control section 120 controls the capacitance of the circuit in a manner to adjust the oscillation frequency of the oscillator 10, based on the AFC. The second capacitance control section 120 may increase or decrease the capacitance using a control signal based on a predetermined function, according to the external input signal input from the input terminal 32.

The oscillation circuit 200 is connected to the oscillator 10, causes the oscillator 10 to oscillate with an oscillation frequency, and outputs an oscillated frequency signal. The oscillation circuit 200 includes a first variable capacitance section 210, a second variable capacitance section 220, a third variable capacitance section 230, a fourth variable capacitance section 240, a resistance 250, and an amplifying section 260.

The first variable capacitance section 210, the second variable capacitance section 220, the third variable capacitance section 230, and the fourth variable capacitance section 240 include elements with capacitances that change according to electrical signals input thereto. In the present embodiment, the first variable capacitance section 210, the second variable capacitance section 220, the third variable capacitance section 230, and the fourth variable capacitance section 240 may include elements or circuits with capacitances that change according to voltage input thereto, and include varactor diodes, ferroelectric capacitors, transistor circuits, and/or MEMS elements, for example.

The first variable capacitance section 210 and the second variable capacitance section 220 are connected in parallel between one terminal of the oscillator 10 and a reference potential. Here, the reference potential may be the ground potential. By changing the capacitance of at least one of the first variable capacitance section 210 and the second variable capacitance section 220, the capacitance between the one terminal of the oscillator 10 and the reference potential is adjusted. FIG. 1 shows an example in which the first capacitance control section 110 controls the capacitance of the first variable capacitance section 210 and the second capacitance control section 120 controls the capacitance of the second variable capacitance section 220.

The third variable capacitance section 230 and the fourth variable capacitance section 240 are connected in parallel between the other terminal of the oscillator 10 and the reference potential. By changing the capacitance of at least one of the third variable capacitance section 230 and the fourth variable capacitance section 240, the capacitance between the other terminal of the oscillator 10 and the reference potential is adjusted. FIG. 1 shows an example in which the first capacitance control section 110 controls the capacitance of the third variable capacitance section 230 and the second capacitance control section 120 controls the capacitance of the fourth variable capacitance section 240.

The resistance 250 and the amplifying section 260 are connected in parallel between the one terminal and the other terminal of the oscillator 10. Specifically, the resistance 250 is connected between the input and the output of the amplifying section 260, and operates as a feedback resistance. The amplifying section 260 may be an inverter that inverts and amplifies the input signal, and outputs the resulting signal. The amplifying section 260 outputs a portion of an amplified signal as the frequency signal of the oscillation circuit. The first to fourth variable capacitance sections described above, the resistance 250, and the amplifying section 260 operate as an oscillation circuit that causes the oscillator 10 to oscillate. The oscillation circuit 200 may further include a resistance for limiting the current, an amplification circuit for amplifying the frequency signal, and the like.

With the resonance frequency of the oscillator 10 being $f_r$, and the difference between the resonance frequency and the actual oscillation frequency being $\delta f$, $\delta f / f_r$ is expressed as shown in the following expression. Here, $C_A$ and $C_B$ are constants of the capacitance components included in the equivalent circuit determined by the oscillator 10, and $C_L$ is a constant of the load capacitance connected to both ends of the oscillator 10. In other words, by increasing (or decreasing) the load capacitance, it is possible to adjust the oscillation frequency of the oscillator 10 toward the low frequency side (or high frequency side).

$$\delta f/f_r = 0.5 \cdot C_A / \{C_B \cdot (1 + C_L/C_B)\}$$ Expression 1:

With $C_1$ representing the capacitance connected to one end of the oscillator 10 and $C_2$ representing the capacitance connected to the other end of the oscillator 10, for example, $C_L$ is expressed as shown in the following expression. Here, $C_S$ is the parasitic capacitance of the oscillation circuit 200.

$$C_L = C_1 \cdot C_2/(C_1 + C_2) + C_S$$ Expression 2:

Specifically, the oscillation apparatus 1000 controls the oscillation frequency by adjusting the capacitance of the first variable capacitance section 210 and/or the second variable capacitance section 220 to change the value of $C_1$, for example. In this case, the oscillation apparatus 1000 controls the oscillation frequency by adjusting the capacitance of the third variable capacitance section 230 and/or the fourth variable capacitance section 240 to change the value of $C_2$. As an example, the oscillation apparatus 1000 decreases the value of $C_1$ and/or $C_2$ to adjust the oscillation frequency toward the high frequency side. As another example, the oscillation apparatus 1000 increases the value of $C_1$ and/or $C_2$ to adjust the oscillation frequency toward the low frequency side.

In this way, the oscillation apparatus 1000 performs a frequency adjustment according to temperature compensation and a frequency adjustment according to AFC, and outputs a frequency signal with a stable oscillation frequency. The following describes the temperature characteristic of the oscillation frequency of the oscillator 10.

Figure 2:
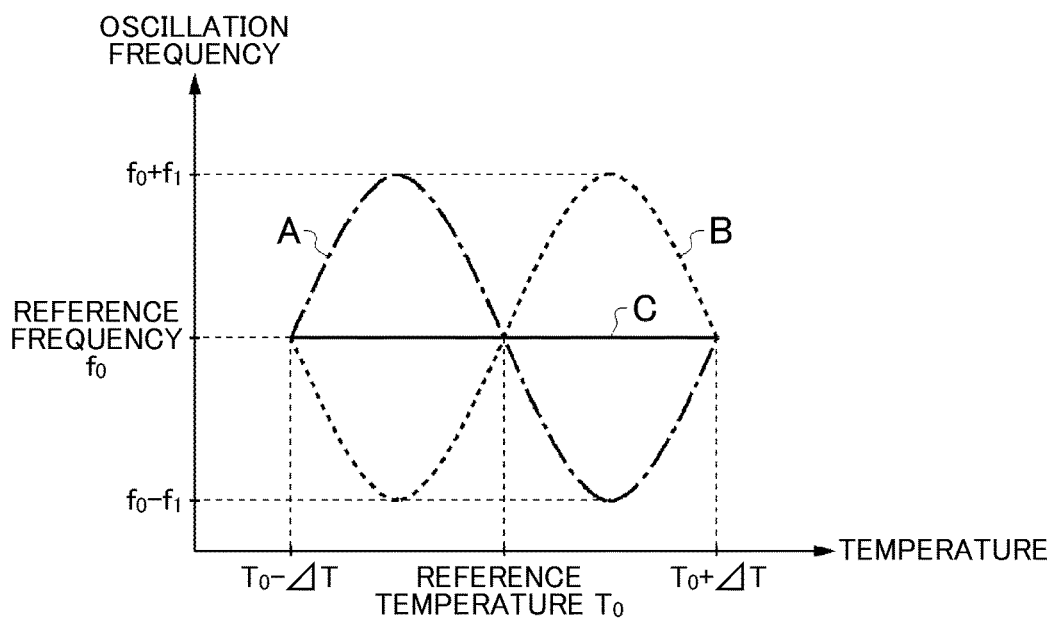
FIG. 2 shows a first example of the temperature characteristic of the oscillation frequency of the oscillator 10.

FIG. 2 shows a first example of the temperature characteristic of the oscillation frequency of the oscillator 10. In FIG. 2, the horizontal axis indicates the temperature and the vertical axis indicates the oscillation frequency. Furthermore, in FIG. 2, the curve A indicates an exemplary temperature characteristic of the AT-cut oscillator 10, and has a characteristic of being able to be approximated by a third-order function relative to the temperature. As an example, the oscillator 10 that has a reference frequency $f_0$ at a reference temperature $T_0$ has an oscillation frequency that fluctuates in a range from $f_0 - f_1$ to $f_0 + f_1$ in a temperature range from $T_0 - \Delta T$ to $T_0 + \Delta T$.

By acquiring the temperature characteristic of such an oscillator 10 through measurement in advance or the like, the oscillation apparatus 1000 can compensate for the fluctuation of the oscillation frequency of the oscillator 10. The oscillation apparatus 1000 uses the curve B, which has the inverse characteristic of the curve A, for example, and adds a frequency correction value corresponding to a point on this curve B relative to the detected temperature. As an example, the first capacitance control section 110 controls the capacitance of the first variable capacitance section 210 and/or the third variable capacitance section 230 to change the oscillation frequency by a frequency that is the difference between the frequency $f_B(T)$ on the curve B relative to the temperature T detected by the temperature detecting section 20 and the frequency $f_A(T)$ on the curve A. In this way, the oscillation apparatus 1000 can stabilize the oscillation frequency of the oscillator 10 at a substantially constant frequency, as shown by the straight line C.

In addition to this, the oscillation apparatus 1000 changes the oscillation frequency of the oscillator 10 to a frequency corresponding to the AFC control. However, when changing the oscillation frequency of the oscillator 10, the temperature characteristic of the oscillator 10 becomes a different characteristic than is shown by the curve A in FIG. 2, and therefore even if the oscillation apparatus 1000 changes the oscillation frequency using the curve B, the oscillation frequency cannot be stabilized to be the straight line C.

Figure 3:
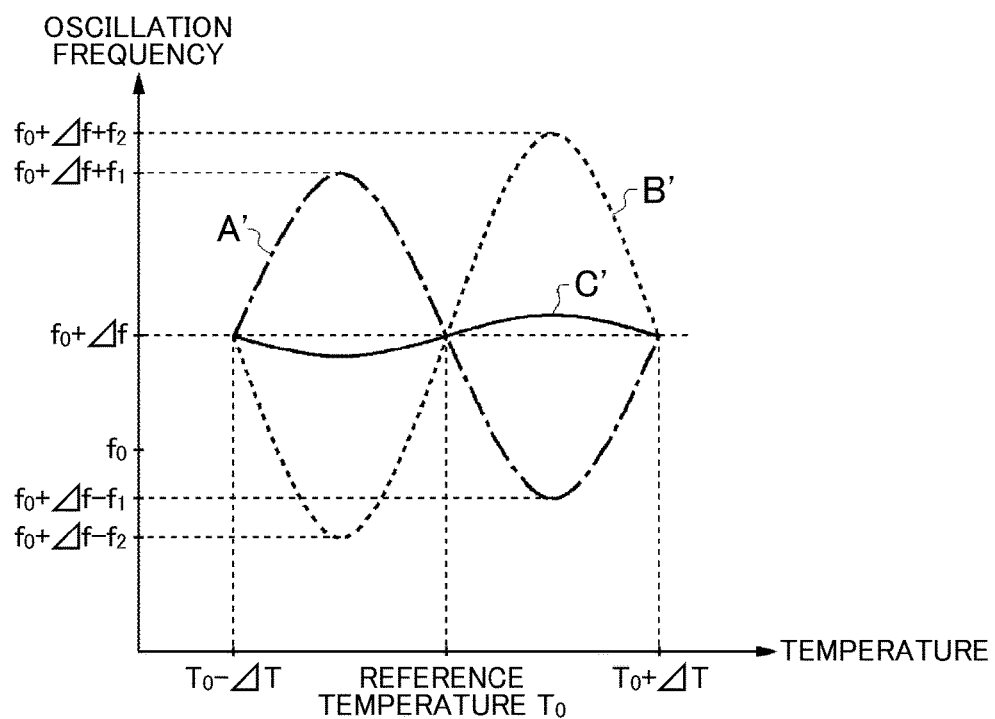
FIG. 3 shows a second example of the temperature characteristic of the oscillation frequency of the oscillator 10.

FIG. 3 shows a second example of the temperature characteristic of the oscillation frequency of the oscillator 10. In FIG. 3, the horizontal axis indicates the temperature and the vertical axis indicates the oscillation frequency. FIG. 3 shows an example in which the oscillation apparatus 1000 increases the oscillation frequency of the oscillator 10 by $\Delta f$ according to the AFC. FIG. 3 shows, as one example, a result obtained by the second capacitance control section 120 decreasing the capacitance of the second variable capacitance section 220 and/or the fourth variable capacitance section 240 to change the oscillation frequency of the oscillator 10 oscillating at a reference frequency $f_0$ by $+\Delta f$. An example of the temperature characteristic of the oscillator 10 in this case is shown by the curve A'. In this case as well, the temperature characteristic of the oscillator 10 can be approximated by a third-order function, and is substantially the same as a characteristic obtained by shifting the curve A shown in FIG. 2 by $+\Delta f$.

Here, as an example, a case is imagined in which the second capacitance control section 120 decreases the capacitance of the second variable capacitance section 220. The capacitance $C_1$ of the one end of the oscillator 10 is the combined capacitance of the first variable capacitance section 210 and the second variable capacitance section 220, and therefore when the capacitance of the second variable capacitance section 220 is decreased, the effect of the increase and decrease of the capacitance of the first variable capacitance section 210 on the value of the capacitance $C_1$ is increased. Accordingly, when the first capacitance control section 110 compensates for the temperature characteristic of the oscillator 10 by changing the capacitance of the first variable capacitance section 210 according to the compensation amount before the AFC is performed, the compensation amount for the frequency is excessive.

The capacitance $C_2$ of the other end of the oscillator 10 is the combined capacitance of the third variable capacitance section 230 and the fourth variable capacitance section 240, and therefore even when the first capacitance control section 110 changes the capacitance of the third variable capacitance section 230 according to the compensation amount before performing AFC, in the same manner as when the second capacitance control section 120 decreases the capacitance of the fourth variable capacitance section 240, the compensation amount of the frequency is excessive. The curve B' in FIG. 3 shows an example of the frequency compensation amount in a case where the first capacitance control section 110 uses the compensation amount before the AFC is performed to adjust the capacitance of the first variable capacitance section 210 and/or the third variable capacitance section 230.

In this way, the frequency compensation amount of the first capacitance control section 110 fluctuates in a range from $f_0 \Delta f - f_2$ to $T_0 + \Delta f + f_2$ ($f_1 < f_2$), which is larger than the fluctuation range $\pm f_1$ of the oscillation frequency of the oscillator 10, in the temperature range from $T_0 - \Delta T$ to $T_0 + \Delta T$. Accordingly, when the oscillation apparatus 1000 changes the oscillation frequency to the high frequency side using AFC to perform temperature compensation for the oscillator 10, the frequency is compensated excessively as shown by the curve C' and is not stabilized at a substantially constant frequency.

Figure 4:
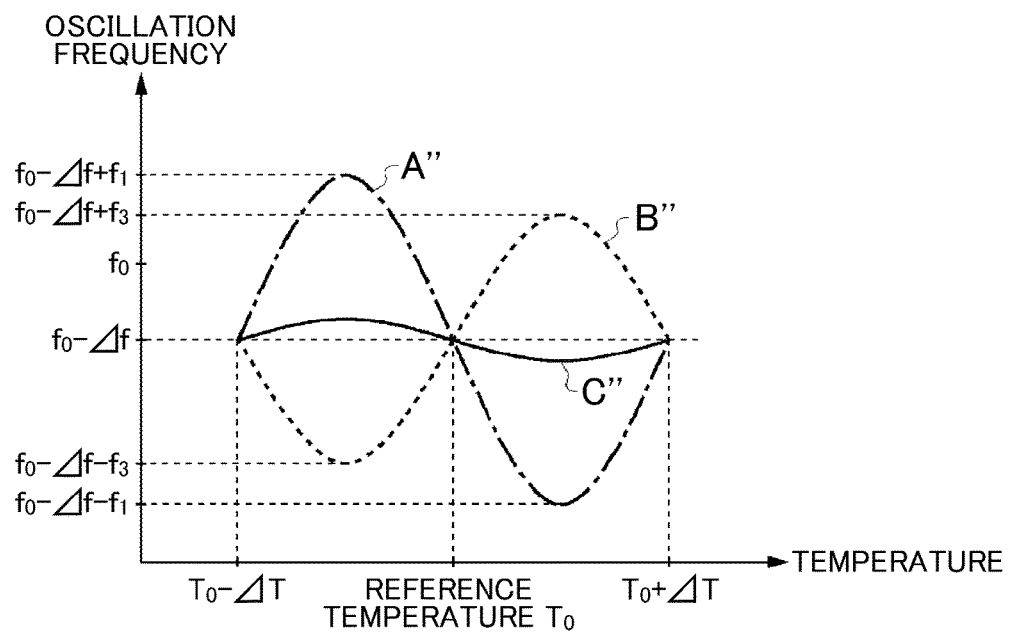
FIG. 4 shows a third example of the temperature characteristic of the oscillation frequency of the oscillator 10.

FIG. 4 shows a third example of the temperature characteristic of the oscillation frequency of the oscillator 10. In FIG. 4, the horizontal axis indicates the temperature and the vertical axis indicates the oscillation frequency. FIG. 4 shows an example in which the oscillation apparatus 1000 decreases the oscillation frequency of the oscillator 10 by Δf according to AFC. FIG. 4 shows, as one example, results obtained by the second capacitance control section 120 increasing the capacitance of the second variable capacitance section 220 and/or the fourth variable capacitance section 240 to change the oscillation frequency of the oscillator 10 oscillating at a reference frequency $f_0$ by −Δf. An example of the temperature characteristic of the oscillator 10 in this case is shown by the curve A". In this case as well, the temperature characteristic of the oscillator 10 can be approximated by a third-order function, and is substantially the same as a characteristic obtained by shifting the curve A shown in FIG. 2 by −Δf.

As described in FIG. 2, the capacitance $C_1$ of the one end of the oscillator 10 is the combined capacitance of the first variable capacitance section 210 and the second variable capacitance section 220, and therefore when the capacitance of the second variable capacitance section 220 is increased, the effect of the increase and decrease of the capacitance of the first variable capacitance section 210 on the value of the capacitance $C_1$ is decreased. Accordingly, when the first capacitance control section 110 compensates for the temperature characteristic of the oscillator 10 by changing the capacitance of the first variable capacitance section 210 according to the compensation amount before the AFC is performed, the compensation amount for the frequency is insufficient. In the same manner, even when the first capacitance control section 110 changes the capacitance of the third variable capacitance section 230 using the compensation amount before the AFC is performed, the compensation amount for the frequency is insufficient.

The curve B" in FIG. 4 shows an example of the frequency compensation amount in a case where the first capacitance control section 110 uses the compensation amount before the AFC is performed to adjust the capacitance of the first variable capacitance section 210 and/or the third variable capacitance section 230. In this way, the frequency compensation amount of the first capacitance control section 110 fluctuates in a range from $f_0-\Delta f - f_3$ to $f_0-\Delta f + f_3$ ($f_1 > f_3$), which is smaller than the fluctuation range $\pm f_1$ of the oscillation frequency of the oscillator 10, in the temperature range from $T_0-\Delta T$ to $T_0+\Delta T$. Accordingly, when the oscillation apparatus 1000 changes the oscillation frequency to the low frequency side using AFC to perform temperature compensation for the oscillator 10, the compensation of the oscillation frequency is insufficient as shown by the curve C" and is not stabilized at a substantially constant frequency.

If the second capacitance control section 120 decreases the capacitance of the second variable capacitance section 220 and/or the fourth variable capacitance section 240 as a result of the AFC, the capacitance of the overall oscillation circuit is decreased. Accordingly, when the first capacitance control section 110 changes the capacitance of the first variable capacitance section 210 and/or the third variable capacitance section 230, the change rate of the capacitance of the overall oscillation circuit becomes relatively larger than before the AFC is performed.

In contrast to this, if the second capacitance control section 120 increases the capacitance of the second variable capacitance section 220 and/or the fourth variable capacitance section 240 as a result of the AFC, the capacitance of the overall oscillation circuit is increased. Accordingly, when the first capacitance control section 110 changes the capacitance of the first variable capacitance section 210 and/or the third variable capacitance section 230, the change rate of the capacitance of the overall oscillation circuit becomes relatively smaller than before the AFC is performed.

In other words, even if the change amount of the capacitance due to the temperature compensation of the oscillation apparatus 1000 is the same, the change amount of the frequency due to this temperature compensation differs according to the direction of the change in the oscillation frequency due to the AFC. For example, the amplitude value of the temperature compensation result (i.e. the curve C') in a case where the oscillation frequency of the oscillator 10 is changed by +Δf due to the AFC is larger than the amplitude value of the temperature compensation result (i.e. the curve C") in a case where the oscillation frequency of the oscillator 10 is changed by −Δf. Accordingly, in order to stabilize the oscillation frequency at a substantially constant frequency using the temperature compensation after the AFC has been performed, it is necessary to use a different frequency compensation value according to the change direction of the oscillation frequency in the AFC. The following describes the oscillation apparatus that performs such a compensation operation.

Figure 5:
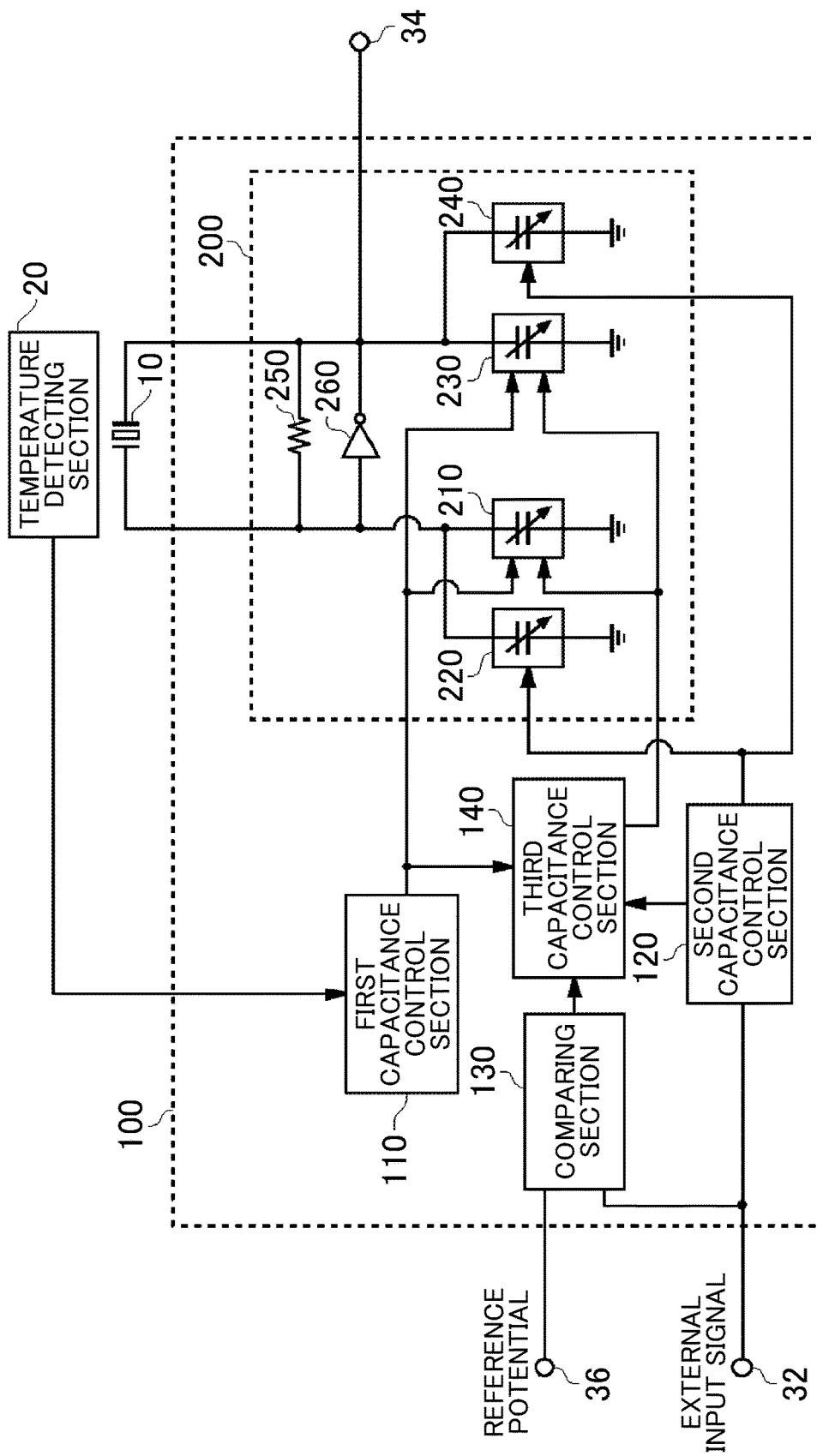
FIG. 5 shows a second exemplary configuration of the oscillation apparatus 1000 according to the present embodiment.

FIG. 5 shows a second exemplary configuration of the oscillation apparatus 1000 according to the present embodiment. In the oscillation apparatus 1000 of the second exemplary configuration, components having substantially the same operation as components in the oscillation apparatus 1000 of the first exemplary configuration shown in FIG. 1 are given the same reference numerals and descriptions thereof are omitted. The oscillation apparatus 1000 of the second exemplary configuration further includes a reference voltage input terminal 36, a comparing section 130, and a third capacitance control section 140. The first capacitance control section 110, the second capacitance control section 120, the comparing section 130, the third capacitance control section 140, and the oscillation circuit 200 function as the oscillation control apparatus 100 that controls the oscillation of the oscillator 10.

The reference voltage input terminal 36 has a predetermined reference voltage input thereto. If the temperature fluctuation of the oscillator 10 has been compensated for (or is not being considered), the reference voltage may be substantially equal to the external input signal that causes the second capacitance control section 120 to make the oscillation frequency of the oscillator 10 the reference frequency $f_0$.

In other words, in a case where the temperature fluctuation has been compensated for, for example, if the external input signal is greater than the reference voltage, the second capacitance control section 120 decreases the capacitance of the second variable capacitance section 220 and/or the fourth variable capacitance section 240 to change the oscillation frequency of the oscillator 10 to be a frequency that is greater than the reference frequency $f_0$. Furthermore, if the external input signal is less than the reference voltage, the second capacitance control section 120 increases the capacitance of the second variable capacitance section 220 and/or the fourth variable capacitance section 240 to change the oscillation frequency of the oscillator 10 to be a frequency that is less than the reference frequency $f_0$. The oscillation apparatus 1000 may generate the reference voltage internally, in which case the reference voltage input terminal 36 does not need to be included.

The comparing section 130 compares the external input signal and the reference voltage. For example, the comparing section 130 outputs a high voltage when the external input signal is greater than or equal to a reference voltage, and outputs a low voltage when the external input signal is less than the reference voltage. The comparing section 130 may be an encoder that outputs one of a predetermined high voltage and a predetermined low voltage in response to the external input signal and the reference voltage. The comparing section 130 includes a comparator, for example.

The third capacitance control section 140 controls the capacitance of a circuit connected to the oscillator 10 based on the comparison results of the external input signal and the reference voltage and on the control signal output by the first capacitance control section 110. The third capacitance control section 140 controls the capacitance of the circuit connected to the oscillator 10 to adjust the oscillation frequency of the oscillator 10. For example, the third capacitance control section 140 controls the first variable capacitance section 210 and/or the third variable capacitance section 230 in a manner to further compensate for a characteristic that remains when the first capacitance control section 110 cannot fully compensate for the temperature characteristic of the oscillation frequency of the oscillator 10. Instead, the third capacitance control section 140 may control the second variable capacitance section 220 and/or the fourth variable capacitance section 240.

The third capacitance control section 140 switches the control circuit or control operation that increases or decreases the capacitance, according to the comparison results of the external input signal and the reference voltage, for example. In this case, the control circuit of the third capacitance control section 140 may use a control signal that has been amplified with a predetermined amplification rate (gain) to generate the control signal that increases or decreases the capacitance. As an example, the third capacitance control section 140 outputs a control signal that has been amplified with a gain for positive-side adjustment when the external input signal is greater than or equal to the reference voltage, and outputs a control signal that has been amplified with a gain for negative-side adjustment when the external input signal is less than the reference voltage.

Instead, the third capacitance control section 140 may use a control signal obtained by multiplying the control signal output by the first capacitance control section 110 by a predetermined coefficient, to increase or decrease the capacitance. For example, the third capacitance control section 140 uses a control signal obtained by multiplying the control signal output by the first capacitance control section 110 by a predetermined coefficient, to increase or decrease the capacitance. The coefficient used by the third capacitance control section 140 may be a coefficient that corresponds to the magnitude of the control signal output by the first capacitance control section 110 and the comparison result of the external input signal and the reference voltage. For example, the third capacitance control section 140 switches this coefficient according to the comparison result of the external input signal and the reference voltage.

The third capacitance control section 140 changes the capacitance of the first variable capacitance section 210 and/or the third variable capacitance section 230 according to the generated control signal. By using such a third capacitance control section 140, the oscillation apparatus 1000 of the second exemplary configuration can perform compensation by using different change amounts for the oscillation frequency of the oscillator 10 according to the change direction from the reference frequency $f_0$ of the oscillation frequency caused by the AFC. The following describes the compensation operation of the oscillation apparatus 1000 of the second exemplary configuration.

Figure 6:
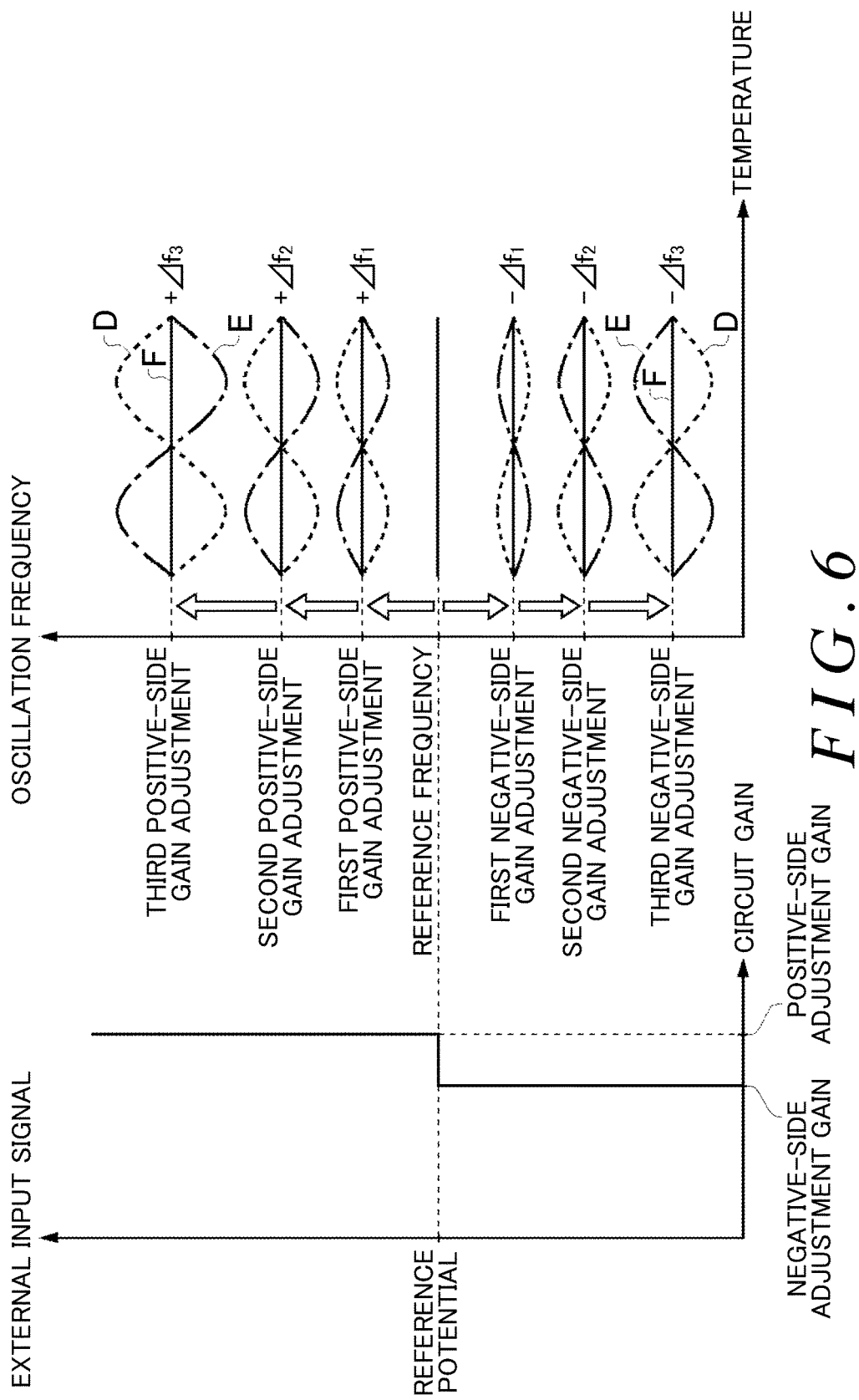
FIG. 6 shows an example of compensation results of the oscillation frequency obtained by the oscillation apparatus 1000 of the second exemplary configuration according to the present embodiment.

FIG. 6 shows an example of compensation results of the oscillation frequency obtained by the oscillation apparatus 1000 of the second exemplary configuration according to the present embodiment. FIG. 6 shows a graph in which the horizontal axis indicates the temperature and the vertical axis indicates the oscillation frequency of the oscillator 10, the external input signal corresponding to the frequencies in this graph, and a graph of the circuit gain corresponding to this external input signal. FIG. 6 shows an example in which the external input signal maintaining the reference frequency $f_0$ has the reference voltage. In this case, the external input signal has a voltage that is substantially the same as the reference voltage, and when the first capacitance control section 110 compensates for the temperature characteristic of the oscillator 10, the oscillation frequency of the oscillator 10 stabilizes at a frequency substantially the same as the reference frequency $f_0$.

Furthermore, the second capacitance control section 120 shifts the oscillation frequency of the oscillator 10 to the high frequency side in response to the external input signal being greater than the reference voltage as a result of the AFC. In this case, the first capacitance control section 110 compensates for the temperature characteristic of the oscillator 10, but as described in FIG. 3, the frequency compensation amount caused by the temperature compensation is excessive.

The comparing section 130 compares the external input signal and the reference voltage, and outputs a high voltage indicating that the external input signal is high. In response to the high voltage of the comparison result, the third capacitance control section 140 adjusts the oscillation frequency of the oscillator 10 using the positive-side adjustment gain. As an example, the third capacitance control section 140 amplifies the control signal output by the first capacitance control section 110 with the positive-side adjustment gain. The temperature characteristic shown by the curve C' in FIG. 3 is a result of excessive compensation by the first capacitance control section 110 using a predetermined function, and therefore the positive-side adjustment gain may be determined in advance in a manner to have the inverse characteristic of the control signal output by the first capacitance control section 110, in a manner to correct the excessive portion of the compensation.

In this way, the third capacitance control section 140 can adjust the first variable capacitance section 210 and/or the third variable capacitance section 230 in a manner to make the temperature characteristic shown by the curve C' in FIG. 3 a substantially constant temperature characteristic. In other words, even when the second capacitance control section 120 changes the oscillation frequency of the oscillator 10 using the AFC, the oscillation apparatus 1000 according to the present embodiment can perform compensation to make the oscillation frequency of the oscillator 10 have a substantially constant temperature characteristic by having the third capacitance control section 140 compensate for the temperature characteristic that occurs as a result of the change.

FIG. 6 shows a "first positive-side adjustment," a "second positive-side adjustment," and a "third positive-side adjustment" that are examples obtained when the second capacitance control section 120 has shifted the oscillation frequency respectively by $+\Delta f_1$, $+\Delta f_2$, and $+\Delta f_3$ and the third capacitance control section 140 uses a positive-side adjustment gain to stabilize the oscillation frequency respectively at $f_0+\Delta f_1$, $f_0+\Delta f_2$, and $f_0+\Delta f_3$. The result of the excessive compensation by the first capacitance control section 110 is shown by the dotted curve, the frequency adjustment amount of the third capacitance control section 140 is shown by the single-dot chain curve, and the combination of these curves, which is the adjustment result, is shown by the solid straight line.

For example, the "third positive-side adjustment" example shows a result obtained by the second capacitance control section 120 shifting the oscillation frequency of the oscillator 10 by $+\Delta f_3$. Specifically, the result of the excessive compensation by the first capacitance control section 110 is the curve D, the frequency adjustment amount of the third capacitance control section 140 compensating for the temperature characteristic of the curve D is the curve E, and the compensation result is the straight line F.

In the same manner, the second capacitance control section 120 shifts the oscillation frequency of the oscillator 10 to the low frequency side in response to the external input signal being less than the reference voltage as a result of the AFC. In this case, the first capacitance control section 110 compensates for the temperature characteristic of the oscillator 10, but as described in FIG. 4, the frequency compensation amount caused by the temperature compensation is insufficient.

The comparing section 130 compares the external input signal and the reference voltage, and outputs a low voltage indicating that the external input signal is low. In response to the low voltage of the comparison result, the third capacitance control section 140 adjusts the oscillation frequency of the oscillator 10 using the negative-side adjustment gain. As an example, the third capacitance control section 140 amplifies the control signal output by the first capacitance control section 110 with the negative-side adjustment gain. In this way, even when the second capacitance control section 120 changes the oscillation frequency of the oscillator 10 using the AFC, the oscillation apparatus 1000 according to the present embodiment can perform compensation to make the oscillation frequency of the oscillator 10 have a substantially constant temperature characteristic by having the third capacitance control section 140 compensate for the temperature characteristic that occurs as a result of the change.

FIG. 6 shows a "first negative-side adjustment," a "second negative-side adjustment," and a "third negative-side adjustment" that are examples obtained when the second capacitance control section 120 has shifted the oscillation frequency respectively by $\times \Delta f_1$, $\times \Delta f_2$, and $\times \Delta f_3$ and the third capacitance control section 140 uses a negative-side adjustment gain to stabilize the oscillation frequency respectively at $f_0 - \Delta f_1$, $f_0 - \Delta f_2$, and $f_0 \times \Delta f_3$. The result of the insufficient compensation by the first capacitance control section 110 is shown by the dotted curve, the frequency adjustment amount of the third capacitance control section 140 is shown by the single-dot chain curve, and the combination of these curves, which is the adjustment result, is shown by the solid straight line.

For example, the "third negative-side adjustment" example shows a result obtained by the second capacitance control section 120 shifting the oscillation frequency of the oscillator 10 by $-\Delta f_3$. Specifically, the result of the insufficient compensation by the first capacitance control section 110 is the curve D, the frequency adjustment amount of the third capacitance control section 140 compensating for the temperature characteristic of the curve D is the curve E, and the compensation result is the straight line F. In the manner described above, the oscillation apparatus 1000 of the second configuration example can perform suitable compensation adjustment according to the fluctuation direction of the frequency caused by the AFC.

However, when such an oscillation apparatus 1000 is actually formed by an electronic circuit or the like, an offset error occurs in the second capacitance control section 120, the third capacitance control section 140, and the like, and there are cases where this offset error is superimposed on the control signal for controlling the capacitance of the oscillation circuit 200. Therefore, there is an idea to adjust the external input signal in a manner to cancel out this offset error. However, the oscillation apparatus 1000 of the second exemplary configuration switches the temperature compensation operation according to the result of the comparison between the external input signal and the reference voltage, and therefore there are cases where the magnitude of the offset error makes it impossible to stabilize the oscillation frequency of the oscillator 10.

As an example, with $\Delta f_4$ representing the frequency shift amount corresponding to the offset error generated in the oscillation apparatus 1000, an external system supplies the oscillation apparatus 1000 with an external input signal from which a signal component corresponding to this shift amount $\Delta f_4$ has been subtracted. Accordingly, the external input signal is shifted according to the offset error, and therefore there are cases where the switching operation of the temperature compensation operation is not performed correctly.

Figure 7:
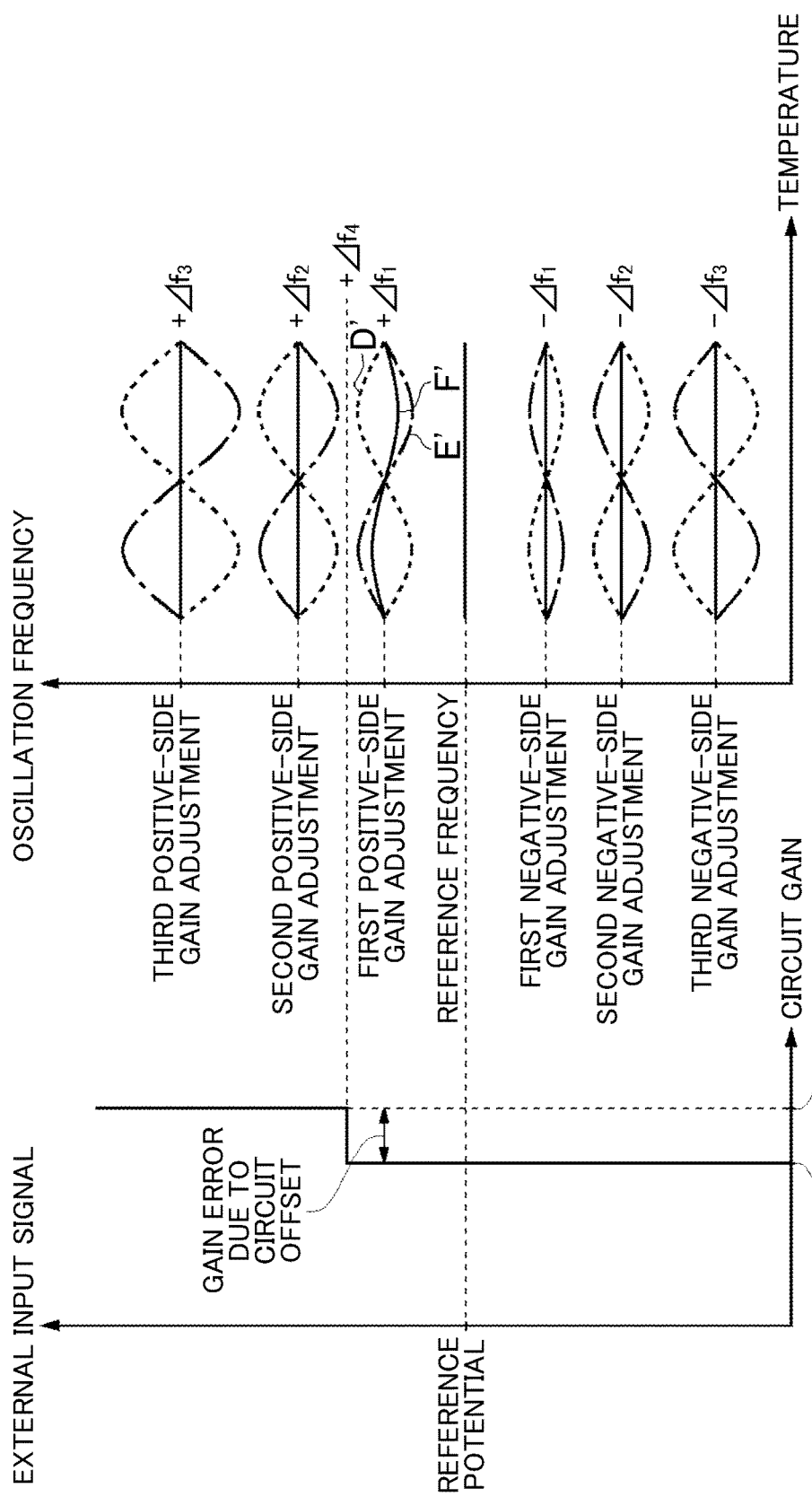
FIG. 7 shows an exemplary case in which an offset error occurs in the oscillation apparatus 1000 of the second exemplary configuration according to the present embodiment.

FIG. 7 shows an exemplary case in which an offset error occurs in the oscillation apparatus 1000 of the second exemplary configuration according to the present embodiment. In the same manner as FIG. 6, FIG. 7 shows a graph in which the horizontal axis indicates the temperature and the vertical axis indicates the oscillation frequency of the oscillator 10, the external input signal corresponding to the frequency in this graph, and a graph of the circuit gain corresponding to this external input signal.

FIG. 7 shows an example in which, in response to an offset error occurring in the second capacitance control section 120 and/or the third capacitance control section 140, an external input signal for cancelling out this offset error is supplied. Specifically, the offset error does not affect the control of the capacitance of the oscillation circuit 200, and the oscillation frequency of the oscillator 10 is changed to a frequency corresponding to the shift amount of the frequency corresponding to the external input signal.

For example, in a case where the frequency shift amount is $+\Delta f_1$ and the frequency shift amount corresponding to the offset error is $+\Delta f_4$, the external input signal is a signal corresponding to the frequency $f_0 + \Delta f_1 - \Delta f_4$. In this way, when the offset error is superimposed, the frequency shift amount is $+\Delta f_1$, and therefore the oscillation circuit 200 shifts the oscillation frequency of the oscillator 10 to the high frequency side (positive side). Here, if $\Delta f_1 - \Delta f_4 > 0$, the output of the comparing section 130 is the high voltage and the third capacitance control section 140 uses the positive-side adjustment gain, and therefore the oscillation apparatus 1000 can stabilize the oscillation frequency of the oscillator 10 at $f_0 + \Delta f_1$.

However, if $\Delta f_1 - \Delta f_4 < 0$, the output of the comparing section 130 is the low voltage and, regardless of the oscillation circuit 200 having shifted the oscillation frequency of the oscillator 10 to the high frequency side (positive side), the third capacitance control section 140 uses the negative-side adjustment gain according to the external input signal. Accordingly, the oscillation apparatus 1000 cannot compensate for the temperature characteristic of the oscillator 10. Furthermore, the third capacitance control section 140 changes the oscillation frequency of the oscillator 10 using a characteristic that approximates the temperature characteristic to be corrected, and therefore the characteristic of the insufficient compensation result by the first capacitance control section 110 is further worsened.

FIG. 7 shows an example in which the frequency shift amount corresponding to the offset error is $+\Delta f_4$ and the absolute value of this shift amount is greater than $+\Delta f_1$ ($\Delta f_1 < \Delta f_4$). In this case, if the frequency shift amount corresponding to the external input signal is greater than 0 and less than $\Delta f_4$, the third capacitance control section 140 uses the negative-side adjustment gain but, on the other hand, the oscillation circuit 200 shifts the oscillation frequency of the oscillator 10 to the high frequency side (positive side). Accordingly, in a frequency range of greater than the reference frequency $f_0$ and less than $+\Delta f_4$, the oscillation apparatus 1000 cannot stabilize the oscillation frequency of the oscillator 10.

In addition, when the oscillation apparatus 1000 is actually formed with an electronic circuit or the like, if the external input signal has a value close to the reference voltage, there are cases where the oscillation apparatus 1000 causes fluctuation in the oscillation frequency of the oscillator 10. Specifically, since the comparing section 130 compares two potentials that are substantially the same, the comparing section 130 outputs one of the high voltage and the low voltage in an unstable manner, and the oscillation circuit 200 creates chatter that causes fluctuation in the oscillation frequency of the oscillator 10.

Figure 8:
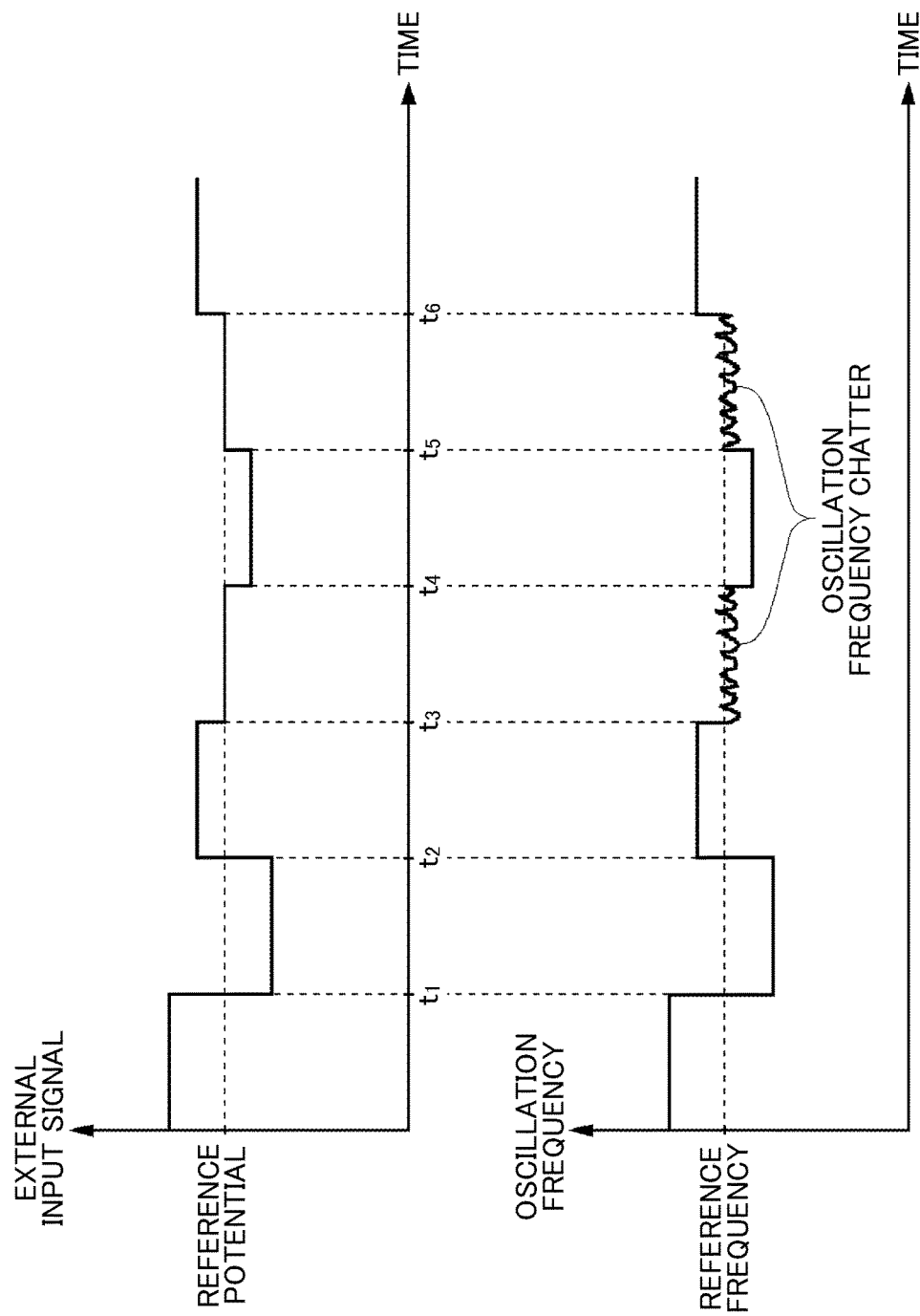
FIG. 8 shows an example of the oscillation frequency output by the oscillation apparatus 1000 according to the present embodiment.

FIG. 8 shows an example of the oscillation frequency output by the oscillation apparatus 1000 according to the present embodiment. In FIG. 8, the horizontal axis indicates time and the vertical axis indicates the oscillation frequency corresponding to the external input signal. FIG. 8 shows an example in which the external input signal changes over time, and the oscillation frequency corresponding to the change of this external input signal is output by the oscillation apparatus 1000. In the same manner as described in FIGS. 1 to 6, the oscillation apparatus 1000 can oscillate the oscillator 10 at the oscillation frequency corresponding to the external input signal.

However, when the external input signal is a value substantially equal to the reference voltage, the oscillation apparatus 1000 causes fluctuation in the oscillation frequency. In particular, when noise or the like is superimposed on the external input signal, there are cases where the oscillation frequency reacts sensitively to the fluctuation of the noise. For example, in the time period from the timing $t_3$ to the timing $t_4$ and in the time period from the timing $t_5$ to the timing $t_6$, the oscillation apparatus 1000 creates chatter in the oscillation frequency. As described above, there are cases where the oscillation apparatus 1000 of the second exemplary configuration cannot compensate for the temperature characteristic and cases where the output frequency fluctuates, due to the magnitude of the external input signal.

Figure 9:
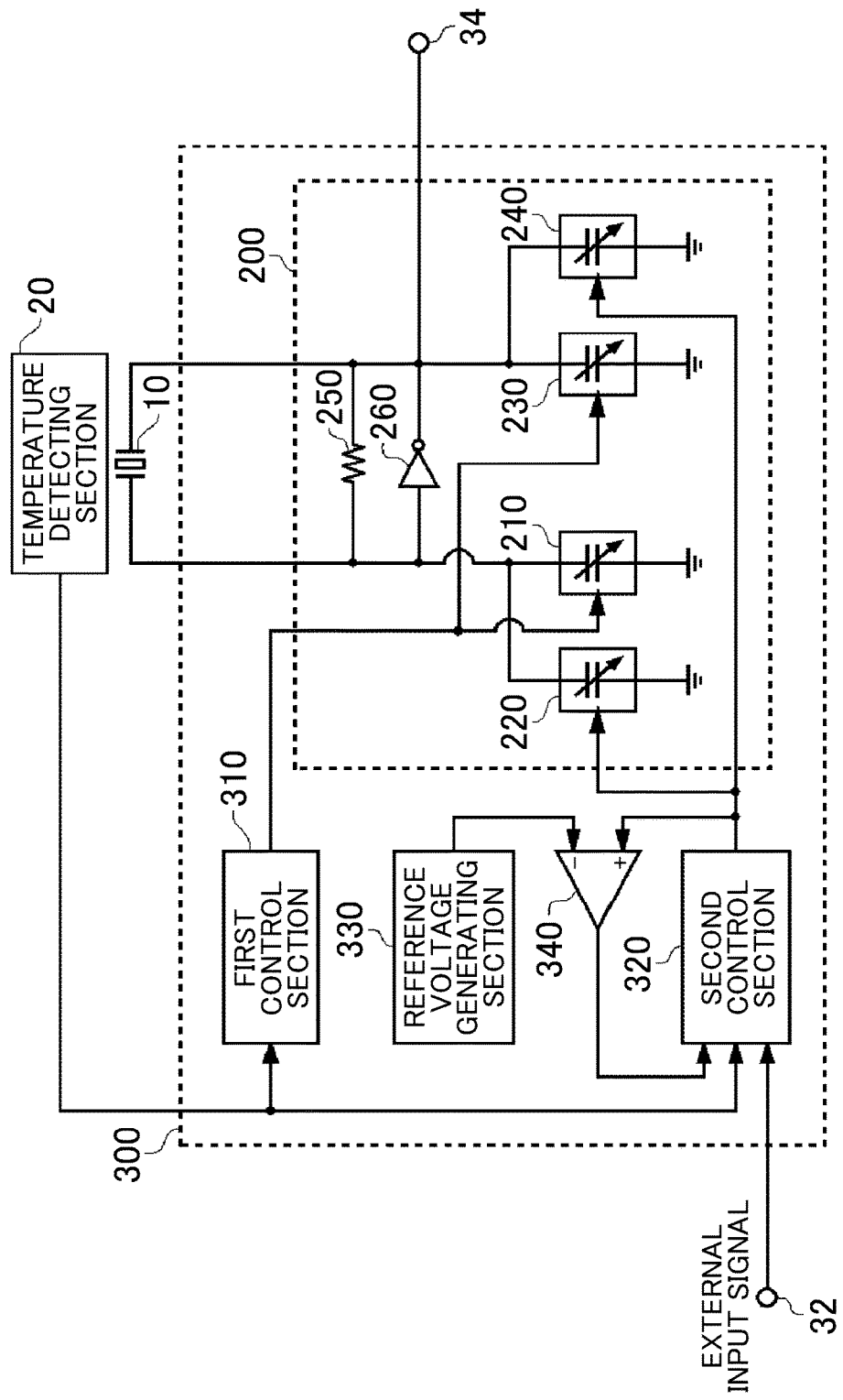
FIG. 9 shows an exemplary configuration of the oscillation apparatus 2000 according to the present embodiment.

Therefore, the oscillation apparatus 2000 according to the present embodiment compensates for the temperature characteristic and prevents the fluctuation of the output frequency, regardless of the magnitude of the external input signal. FIG. 9 shows an exemplary configuration of the oscillation apparatus 2000 according to the present embodiment. In the oscillation apparatus 2000, components having substantially the same operation as components in the oscillation apparatus 1000 of the first exemplary configuration shown in FIG. 1 are given the same reference numerals and descriptions thereof are omitted.

The oscillation apparatus 2000 includes the oscillator 10, the temperature detecting section 20, the input terminal 32, the output terminal 34, an oscillation circuit 200, a first control section 310, a second control section 320, a reference voltage generating section 330, and an encoder 340. The oscillator 10, the temperature detecting section 20, the input terminal 32, and the output terminal 34 are described in FIG. 1, and are therefore not described here. The oscillation circuit 200, the first control section 310, the second control section 320, the reference voltage generating section 330, and the encoder 340 function as an oscillation control apparatus 300 that controls the oscillation of the oscillator 10.

The first control section 310 generates a first control signal that controls the oscillation frequency of the oscillator 10, based on the temperature detection result of the oscillator 10. The first control section 310 controls the capacitance of the circuit connected to the oscillator 10 to adjust the oscillation frequency of the oscillator 10. As an example, the first control section 310 transmits the first control signal to the first variable capacitance section and/or the third variable capacitance section, and controls the oscillation frequency by changing each capacitance in a manner to compensate for the temperature characteristic of the oscillation frequency of the oscillator 10. The first control section 310 may perform substantially the same operation as the first capacitance control section 110 described in FIG. 1.

The second control section 320 generates a second control signal that controls the oscillation frequency of the oscillator 10, based on the temperature detection result of the oscillator 10, the external input signal input from the outside, and a feedback signal from the encoder 340. The second control section 320 receives feedback of the comparison result between the output second control signal and a reference voltage, and adjusts the second control signal being output according to the temperature detection result. The second control section 320 generates the second control signal in a manner to stably oscillate the oscillator 10 at an oscillation frequency based on the AFC.

As an example, the second control section 320 transmits the second control signal to the second variable capacitance section and/or the fourth variable capacitance section, and changes each capacitance to control the oscillation frequency while compensating for the temperature characteristic of the oscillation frequency of the oscillator 10. In the same manner as described in FIG. 6, the second control section 320 may select one of the positive-side adjustment gain and the negative-side adjustment gain, and amplify the external input signal by the selected gain to generate the second control signal.

The reference voltage generating section 330 generates the reference voltage. The reference voltage generating section 330 may generate the reference voltage described in FIGS. 5 and 6. Specifically, FIG. 5 shows an example in which the reference voltage from the reference voltage input terminal 36 is input, and FIG. 9 shows an example in which the reference voltage is generated within the oscillation apparatus 2000. Here, in a case where the first control section 310 compensates for the temperature characteristic of the oscillator 10 and the oscillation frequency of the oscillator 10 is stabilized at a frequency substantially the same as the reference frequency $f_0$, the voltage maintaining this oscillation frequency of the oscillator 10 is the reference voltage.

The encoder 340 generates a feedback signal. The encoder 340 generates the feedback signal by comparing the second control signal and the reference voltage. The encoder 340 outputs digital data that indicates the difference between the reference voltage and the second control signal. The encoder 340 may convert the difference between the reference voltage and the second control signal into digital data based on a comparison result between this difference and a threshold value. For example, the encoder 340 outputs a high voltage if the difference between the external input signal and the reference voltage is greater than or equal to 0, and outputs a low voltage if this difference is less than 0. In this case, the encoder 340 may perform substantially the same operation as the comparing section 130 shown in FIG. 5. As an example, the encoder 340 includes a comparator. Furthermore, the level of the threshold value of the encoder 340 may have a hysteresis. An example in which the threshold value level has a hysteresis is described further below.

The oscillation circuit 200 sets the oscillation frequency of the oscillator 10 based on the first control signal and the second control signal. The oscillation circuit 200 includes the first variable capacitance section 210, the second variable capacitance section 220, the third variable capacitance section 230, the fourth variable capacitance section 240, a resistance 250, and an amplifying section 260. The oscillation circuit 200 sets the oscillation frequency of the oscillator 10 based on the capacitances of the first variable capacitance section 210, the second variable capacitance section 220, the third variable capacitance section 230, and the fourth variable capacitance section 240.

The first variable capacitance section 210 and/or the third variable capacitance section 230 change the capacitance values based on the first control signal. The second variable capacitance section 220 and/or the fourth variable capacitance section 240 change the capacitance values based on the second control signal. The operations of the first variable capacitance section 210, the second variable capacitance section 220, the third variable capacitance section 230, the fourth variable capacitance section 240, the resistance 250, and the amplifying section 260 are described in FIG. 1, and are therefore not described here.

The oscillation apparatus 2000 according to the present embodiment described above uses the first control signal generated by the first control section 310 to change the oscillation frequency of the oscillator 10, in the same manner as the oscillation apparatus 1000 shown in FIG. 5. The oscillation apparatus 2000 then uses the second control signal generated by the second control section 320 to further change the oscillation frequency of the oscillator 10, thereby compensating for the component of the temperature fluctuation of the oscillator 10 that the first control section 310 was unable to fully compensate for and stabilizing the oscillation frequency.

The second control section 320 according to the present embodiment described above performs a feedback operation to generate the second control signal. For example, the second control section 320 generates the second control signal according to the external input signal resulting from the AFC. The second control section 320 then has the digital data indicating the difference between the reference voltage output by the encoder 340 and the second control signal input thereto as the feedback signal. Specifically, the second control section 320 generates the next second control signal using one of the positive-side adjustment gain and the negative-side adjustment gain, according to the comparison result of the encoder 340. The following describes such a first control section 310 and second control section 320.

Figure 10:
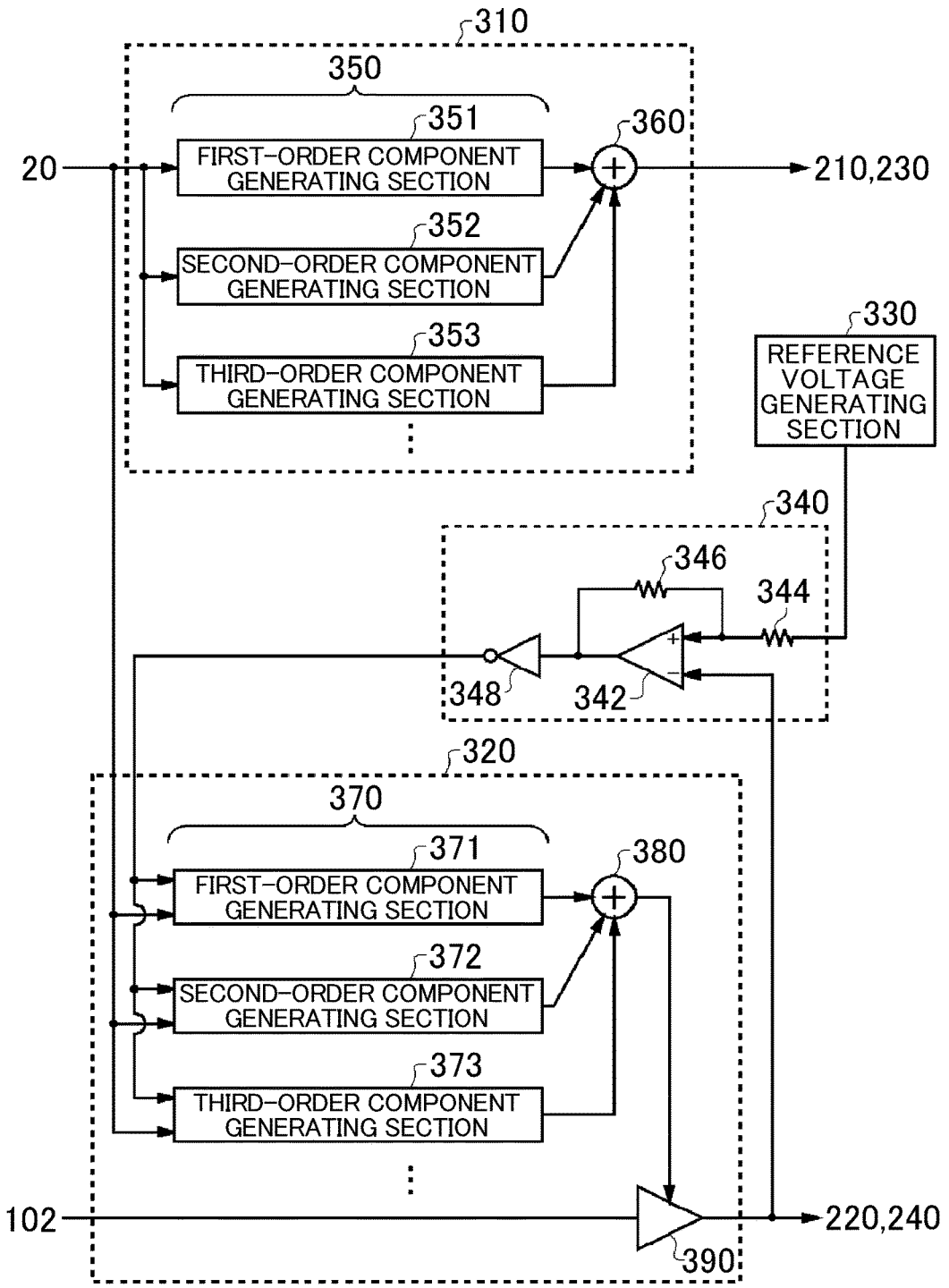
FIG. 10 shows exemplary configurations of the first control section 310, the second control section 320, and the encoder 340 according to the present embodiment.

FIG. 10 shows exemplary configurations of the first control section 310, the second control section 320, and the encoder 340 according to the present embodiment. The first control section 310 generates the first control signal based on a predetermined function. The first control signal compensates for the temperature characteristic that is mainly a third-order function with a reference temperature as the origin, and therefore may have a temperature voltage characteristic that is a third-order function with the reference temperature as the origin. In other words, the first control section 310 may generate the first control signal based on a third-order function with the reference temperature as the origin. Furthermore, the first control section 310 may generate the first control signal based on the sum of functions with odd-numbered orders, such as a first-order function, a fifth-order function, and a seventh-order function with the reference temperature as the origin. In this way, the first control section 310 can more precisely compensate for the temperature characteristic of the oscillator 10.

FIG. 10 shows an example in which the first control section 310 includes an (n-th)-order component generating section 350 that has a first-order component generating section 351, a second-order component generating section 352, and a third-order component generating section 353, and generates an (n-th)-order temperature voltage characteristic with a reference temperature as the origin, according to the temperature detection result of the oscillator 10. The number of orders n of the temperature voltage characteristic is preferably a natural number greater than or equal to 1. Furthermore, the (n-th)-order component generating section 350 may further include generating sections that generate components of the temperature voltage characteristic that are of the fourth order or higher. Instead, the number of orders n of the temperature voltage characteristic may be an odd number greater than or equal to 1.

Furthermore, the first control section 310 includes a first adding section 360 that adds together the n orders of temperature voltage characteristics, and sets the addition result of the first adding section 360 as the first control signal. The first control signal preferably has a characteristic that is the inverse of the temperature characteristic of the oscillator 10. In this way, the first control section 310 can more precisely compensate for the temperature characteristic of the oscillator 10 by adding together a greater number of orders of the temperature voltage characteristic to generate the first control signal.

In the same manner as the first control section 310, the second control section 320 includes an (n-th)-order component generating section 370 that has a first-order component generating section 371, a second-order component generating section 372, and a third-order component generating section 373, etc. Furthermore, the second control section 320 includes a second adding section 380 and an amplifying section 390. The (n-th)-order component generating section 370 outputs each temperature voltage characteristic corresponding to the comparison result of the encoder 340 and the temperature detection result of the temperature detecting section 20. The number of orders n of the temperature voltage characteristic is preferably a natural number greater than or equal to 1.

In this way, the second control section 320 can more precisely compensate for the temperature characteristic of the oscillator 10 by adding together a greater number of orders of the temperature voltage characteristic to generate the second control signal. Furthermore, even when a small nonlinear component or the like occurs as the result of the first control section 310 compensating for the temperature characteristic of the oscillator 10, the second control section 320 can precisely compensate for the temperature characteristic of the oscillator 10 by using a greater number of orders of the temperature voltage characteristic. Such a small nonlinear component or the like has a characteristic with an even number of orders, and the second control section 320 preferably generates the second control signal using a temperature voltage characteristic with an even number of orders in addition to a temperature voltage characteristic with an odd number of orders.

For example, when the temperature detection result is $T_x$ and the comparison result of the encoder 340 is the high voltage, the second control section 320 compensates for the excessive compensation of the temperature characteristic made by the first control section 310 as shown by the curve C' in FIG. 3. The (n-th)-order component generating section 370 outputs each value corresponding to the temperature $T_x$ in the temperature voltage characteristic compensating for the component of the excessive compensation of the temperature characteristic made by the first control section 310. Here, with $F_{1n}(T)$ representing the temperature voltage characteristic compensating for the temperature characteristic of the curve C', the second control section 320 generates $F_{1n}(T)$.

Furthermore, when the comparison result of the encoder 340 is the low voltage, the second control section 320 compensates for the component of the insufficient compensation of the temperature characteristic made by the first control section 310 as shown in the curve C" in FIG. 4. The (n-th)-order component generating section 370 outputs each value corresponding to the temperature $T_x$ in the temperature voltage characteristic compensating for the component of the insufficient compensation of the temperature characteristic made by the first control section 310. Here, with $F_{2n}(T)$ representing the temperature voltage characteristic compensating for the temperature characteristic of the curve C", the second control section 320 generates $F_{2n}(T_x)$.

The second adding section 380 adds together the n orders of the temperature voltage characteristic with the reference temperature as the origin, corresponding to the temperature detection result of the oscillator 10 and the comparison result of the second control signal and the reference voltage. The second adding section 380 supplies the amplifying section 390 with the addition result. Specifically, the second adding section 380 supplies the amplifying section 390 with $\Sigma_n\{F_{1n}(T_x)\}$ when the comparison result of the encoder 340 is the high voltage and with $\Sigma_n\{F_{2n}(T_x)\}$ when the comparison result of the encoder 340 is the low voltage.

The amplifying section 390 amplifies the external input signal with an amplification rate corresponding to the addition result of the second adding section 380. The amplifying section 390 outputs the amplified external input signal as the second control signal. Specifically, the second control section 320 switches the amplification rate of this amplifying section 390 based on the temperature detection result of the oscillator 10 and the comparison result of the second control signal and the reference voltage. For example, the amplifying section 390 amplifies the external input signal using the positive-side adjustment gain $\Sigma_n\{F_{1n}(T_x)\}$ when the comparison result of the encoder 340 is the high voltage and using the negative-side adjustment gain $\Sigma_n\{F_{2n}(T_x)\}$ when the comparison result of the encoder 340 is the low voltage. In this way, the amplifying section 390 switches the amplification rate according to the addition result of the second adding section 380.

Here, the encoder 340 compares the second control signal output by the second control section 320 and the reference voltage, and therefore even when an offset occurs in a circuit at an earlier stage than the second control section 320 and is superimposed on the second control signal, the encoder 340 compares the second control signal with this offset superimposed thereon and the reference voltage. Specifically, the second control section 320 selects on of the positive-side adjustment gain and the negative-side adjustment gain based on the control signal including the generated offset.

As an example, in a case where the frequency shift amount is $+\Delta f_1$ and the frequency shift amount corresponding to the offset error is $+\Delta f_4$, the external input signal is a signal corresponding to the frequency $f_0+\Delta f_1-\Delta f_4$. In this way, when the offset error is superimposed, the frequency shift amount of the control signal is $+\Delta f_1$, and therefore the oscillation circuit 200 shifts the oscillation frequency of the oscillator 10 to the high frequency side (positive side). Furthermore, since the encoder 340 compares this control signal to the reference voltage, even when the external input signal has a signal voltage corresponding to a frequency $(f_0+\Delta f_1-\Delta f_4)$ that is less than or equal to the reference frequency $f_0$, the comparison result is $f_0+\Delta f_1>f_0$, and therefore the encoder 340 outputs the high voltage. In other words, the amplifying section 390 amplifies the external input signal using the positive-side adjustment gain.

In this way, the oscillation apparatus 2000 according to the present embodiment can suitably compensate for the temperature characteristic of the oscillator 10 in accordance with the gain of the amplifying section 390 and the direction in which the oscillation circuit 200 changes the oscillation frequency, regardless of the value of the external input signal. Furthermore, the oscillation apparatus 2000 adjusts the oscillation frequency of the oscillator 10 according to the external input signal in which the offset error has been reduced, and can therefore oscillate the oscillator 10 with an oscillation frequency corresponding to the shift amount of the external input signal.

Furthermore, the encoder 340 of the present embodiment is an example including a hysteresis comparator. The encoder 340 includes a comparator 342, an input resistance 344, a feedback resistance 346, and an inverter 348. The comparator 342, the input resistance 344, and the feedback resistance 346 operate as the hysteresis comparator having a hysteresis at a threshold value.

For example, in a case where this hysteresis comparator includes a first threshold value $Th_H$ and a second threshold value $Th_L$ and $Th_H>Th_L$, when the difference between the input voltage and the reference voltage exceeds the first threshold value $Th_H$, the output is the low voltage. In this case, the output stays at the low voltage even when the difference between the input voltage and the reference voltage is less than or equal to the first threshold value $Th_H$, and the output switches to the high voltage when this difference becomes less than or equal to the second threshold value $Th_L$. Furthermore, in this case, the output stays at the high voltage even when the difference between the input voltage and the reference voltage exceeds the second threshold value $Th_L$, and the output switches to the low voltage when this difference exceeds the first threshold value $Th_H$.

The first threshold value $Th_H$ and the second threshold value $Th_L$ can be determined according to the input resistance 344, the feedback resistance 346, the reference voltage, the power supply voltage of the comparator 342, and the like. Furthermore, the difference (hysteresis) of the threshold value voltage relative to the full scale of the output can be determined by the ratio between the input resistance 344 and the feedback resistance 346. The inverter 348 inverts the logic of such a hysteresis comparator.

Even when the external input signal includes noise or the like and fluctuates when the external input signal has substantially the same value as the reference voltage, if this fluctuation is within a range of the difference between the first threshold value $Th_H$ and the second threshold value $Th_L$, the encoder 340 can output a stable logic value without reflecting the noise fluctuation. In this way, the encoder 340 prevents the occurrence of chatter even when the external input signal fluctuates, and therefore the oscillation apparatus 2000 can prevent the occurrence of chatter in the oscillation frequency.

Figure 11:
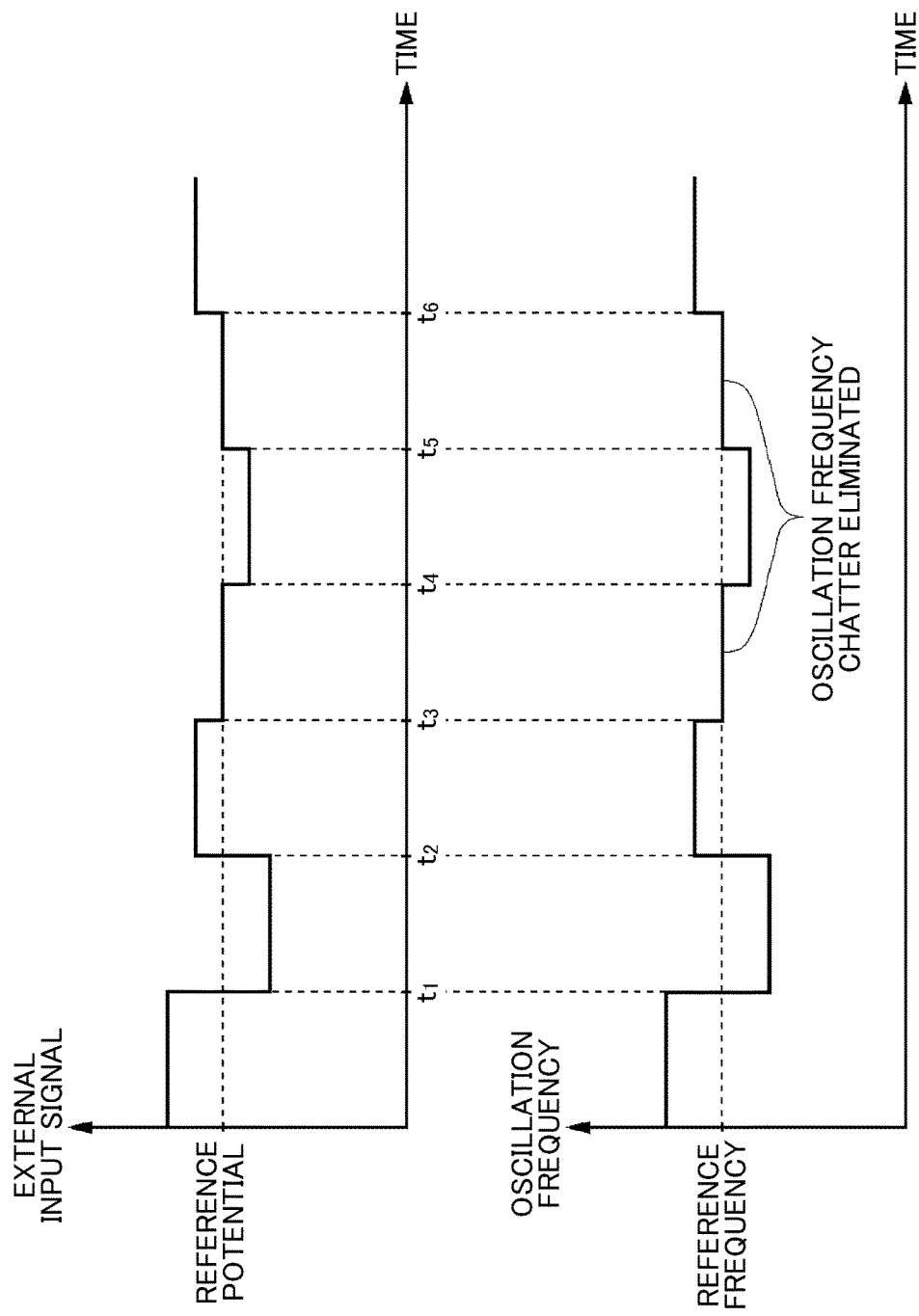
FIG. 11 shows an example of the oscillation frequency output by the oscillation apparatus 2000 according to the present embodiment.

FIG. 11 shows an example of the oscillation frequency output by the oscillation apparatus 2000 according to the present embodiment. In FIG. 11, the horizontal axis indicates time and the vertical axis indicates the oscillation frequency corresponding to the external input signal. FIG. 11 shows an example in which the external input signal changes over time, and the oscillation apparatus 2000 outputs the oscillation frequency corresponding to this changed external input signal. In the same manner as in FIGS. 9 and 10, the oscillation apparatus 2000 can oscillate the oscillator 10 with an oscillation frequency corresponding to the external input signal while compensating the temperature characteristic of the oscillator 10.

Furthermore, even when the external input signal has substantially the same value as the reference voltage, the oscillation apparatus 2000 can operate stably without causing fluctuation in the oscillation frequency. For example, even in the time period from the timing $t_3$ to the timing $t_4$ and in the time period from the timing $t_5$ to the timing $t_6$, the oscillation apparatus 2000 can prevent the occurrence of chatter in the oscillation frequency. As described above, the oscillation apparatus 2000 according to the present embodiment can oscillate the oscillator 10 with a stable output frequency, while compensating the temperature characteristic regardless of the magnitude of the external input signal.

The oscillation apparatus 2000 according to the present embodiment described above is described as an example in which the first control section 310 and the second control section 320 each include an (n-th)-order component generating section, but the present invention is not limited to this. The first control section 310 and/or the second control section 320 may include at least a third-order component generating section, and may generate at least a third-order temperature voltage characteristic.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An oscillation control apparatus comprising:
a first control section that generates a first control signal that controls an oscillation frequency of an oscillator, based on a temperature detection result of a temperature detecting section;
an encoder that generates a feedback signal;
a second control section that generates a second control signal that controls the oscillation frequency of the oscillator, based on the temperature detection result of the temperature detecting section, an external input signal input from outside, and the feedback signal;
an oscillation circuit that sets the oscillation frequency of the oscillator, based on the first control signal and the second control signal; and
a reference voltage generating section that generates a reference voltage, wherein
the encoder generates the feedback signal by comparing the second control signal and the reference voltage.

2. The oscillation control apparatus according to claim 1, wherein
the encoder outputs digital data indicating a difference between the reference voltage and the second control signal, and
the second control section has the digital data input thereto as the feedback signal.

3. The oscillation control apparatus according to claim 2, wherein
the encoder converts the difference between the reference voltage and the second control signal into the digital data based on a comparison result of the difference and a threshold value, and
a level of the threshold value includes a hysteresis.

4. The oscillation control apparatus according to claim 3, wherein
the encoder includes a hysteresis comparator.

5. The oscillation control apparatus according to claim 1, wherein the oscillation circuit:
includes a first variable capacitance section that changes a capacitance value thereof based on the first control signal,
includes a second variable capacitance section that changes a capacitance value thereof based on the second control signal, and
sets the oscillation frequency of the oscillator based on the capacitances of the first variable capacitance section and the second variable capacitance section.

6. The oscillation control apparatus according to claim 1, wherein the second control section:
includes an amplifying section that amplifies the external input signal, and
switches an amplification rate of the amplifying section based on the temperature detection result and a comparison result of the second control signal and the reference voltage.

7. The oscillation control apparatus according to claim 6, wherein
the amplifying section outputs the external input signal that has been amplified, as the second control signal.

8. The oscillation control apparatus according to claim 6, wherein
the second control section includes a second adding section that adds together n orders of a temperature voltage characteristic with a reference temperature as an origin, corresponding to the temperature detection result and the comparison result of the second control signal and the reference voltage, and
the amplification rate of the amplifying section is switched according to an addition result of the second adding section.

9. The oscillation control apparatus according to claim 8, wherein the first control section:
includes a first adding section that adds together n orders of the temperature voltage characteristic with the reference temperature as the origin, according to the temperature detection result, and sets an addition result of the first adding section as the first control signal.

10. The oscillation control apparatus according to claim 8, wherein the number of orders n of the temperature voltage characteristic is a natural number greater than or equal to 1.

11. An oscillation apparatus comprising:

an oscillator;

a temperature detecting section that detects a temperature of the oscillator;

an input terminal that inputs an external input signal from outside; and the oscillation control apparatus according to claim 1.

12. The oscillation apparatus according to claim 11, wherein the oscillator is a crystal oscillator.

* * * * *